United States Patent [19]
Higgins, Jr.

[11] Patent Number: 5,834,983
[45] Date of Patent: Nov. 10, 1998

[54] WIDEBAND OSCILLATOR WITH AUTOMATIC BIAS CONTROL

[75] Inventor: Thomas M. Higgins, Jr., Newman Lake, Wash.

[73] Assignee: Hewlett-Packard Company, Palo Alto, Calif.

[21] Appl. No.: 940,417

[22] Filed: Sep. 30, 1997

[51] Int. Cl.⁶ .............................. H03B 5/04; H03B 5/12
[52] U.S. Cl. ..................... 331/109; 331/117 R; 331/176; 331/183; 331/186; 331/177 V
[58] Field of Search .................................. 331/36 C, 109, 331/117 R, 117 FE, 117 D, 175, 176, 177 V, 182, 183, 185, 186

[56] References Cited

U.S. PATENT DOCUMENTS 5,126,697  6/1992  Nauta et al. ......................... 331/177 R
5,185,583  2/1993  Doi et al. ................................. 331/15

Primary Examiner—David Mis
Attorney, Agent, or Firm—Edward L. Miller

[57] ABSTRACT

A bipolar negative resistance UHF oscillator having a voltage tunable resonator in its emitter circuit is operated at a fixed collector bias current and an RF detector is used as a convenient way to determine the RF current at which the oscillator is operating, by sensing the amplitude of the oscillator's output RF voltage across a constant load. An integrating error amplifier referenced to a desired detector output level responds to the actual detector output level to control the collector bias voltage for the oscillator and maintain the output of the oscillator at a fixed amplitude. Since the collector bias current is fixed, this keeps the operating point at fixed relation with respect to emitter cutoff. That relationship is chosen to be "just below" by initial selection of the constant collector bias current and the reference voltage used by the integrating error amplifier. The result is a VCO tunable over an octave with minimal phase noise, near maximum power output and immunity to temperature variations and shifts in oscillator device parameters.

16 Claims, 5 Drawing Sheets

WIDEBAND OSCILLATOR WITH AUTOMATIC BIAS CONTROL

BACKGROUND OF THE INVENTION

This invention relates to the design of a high frequency wideband voltage controlled oscillator (VCO) such as those intended for use in communications applications where high performance is required. For example, very low phase noise may be desired, or excellent flatness for power output versus frequency change or freedom from power compression may be required. These and other performance characteristics are often significantly influenced by the bias conditions under which the oscillator operates. Optimum bias conditions generally vary greatly as functions of temperature, device characteristics, as well as operating frequency. This can make the design of such a VCO very difficult.

Consider, for example, a VCO that is tunable over an octave (e.g., operates in the 1.5 GHz to 3.0 GHz range) with good output power and superior phase noise. Although FET's are sometimes used, today's VCO's for this type of service are generally bipolar semiconductor "negative resistance" oscillators tuned by a resonant element in the emitter. As noted above, such oscillators require special considerations; see for example, U.S. Pat. No. 5,097,228, issued to Barton L. McJunkin on 17 Mar. 1992. Optimum bias conditions for bipolar negative resistance oscillators do vary greatly with frequency and temperature, as well as with device parameters for the individual oscillator transistor. It is often difficult to select a fixed bias point that will even allow operation over an octave with adequate margins, let alone optimum operation. Thus, some sort of (troublesome) tracking bias arrangement has heretofore been desirable.

Mcjunkin's technique for bias tracking is to vary the collector bias as a function of temperature, or to vary the collector bias as function of both temperature and tuning voltage. A function has to be found that matches the parameters of the oscillator device (including the resonator). Herein lies a difficulty. In a production situation the parameters of the parts may vary over time, and yet still be within limits set by the manufacturer. These variations can be enough to require introductions of different functions in the tracking circuit. This is undesirable, as it consumes engineering and test time during manufacturing, as well as complicates the repair process.

Generally, it would be desirable if for wideband high frequency oscillators there were a way to automatically keep a critical bias condition, that influences an important operational parameter, at a value that optimizes that important operational parameter. More specifically, it would be further desirable if there were a way to eliminate for bipolar negative resistance oscillators the sensitivity of the tracking bias circuit to variations in device parameters while preserving the advantages afforded by the technique of Mcjunkin.

SUMMARY OF THE INVENTION

A general solution to the problem of optimizing the performance of a wide range variable frequency oscillator may lie in identifying one performance parameter, that when optimized also essentially optimizes others, and then developing an indicator signal for that one parameter and incorporating that signal in a feedback loop to keep that indicator signal at a constant value. The applicability of this technique will depend upon there being a particular value for the indicator signal whenever the associated parameter is optimal. In many cases it will be found that the optimal parameter value occurs when the oscillator is operated at just below a maximal level where some form of undesirable nonlinearity or other distortion begins to occur in the oscillatory waveform.

A specific solution to the problem of optimizing the performance of an octave tunable negative resistance VCO whose resonator is in series with the emitter is to appreciate that operation just before emitter cutoff is an excellent choice for minimizing phase noise, and for all other combinations of parameters is a good choice for "optimum" operation. It also produces near maximum power. If the VCO has fixed collector bias current to begin with, then operation just before emitter cutoff results in constant RF collector current. If the oscillator further operates into a fixed load, say fifty ohms, then output power and output voltage across the load are constant, too. Next, recognize that if the collector bias voltage were controlled to keep RF output voltage constant, then the VCO would remain at the optimal operation point despite variations in tuning voltage. And upon further consideration, it will also be appreciated that variations in device parameters and temperature excursions are controlled for as well, since these would otherwise produce movement away from operation at just before emitter cutoff (i.e., changes in RF collector current and hence output voltage across the constant load, since collector bias current is fixed).

Accordingly, the oscillator is operated at a fixed collector bias current and an RF detector is used as a convenient way to measure the RF current at which the oscillator is operating, by sensing the amplitude of the oscillator's output RF voltage across a constant load. An integrating error amplifier referenced to a desired detector output level responds to the actual detector output level to control the collector bias voltage for the oscillator and maintain the output of the oscillator at a fixed amplitude. Since the collector bias current is fixed, this keeps the operating point at fixed relation with respect to emitter cutoff. That relationship is chosen to be "just below" by initial selection of the constant collector bias current and the reference voltage used by the integrating error amplifier.

DESCRIPTION OF A PREFERRED EMBODIMENT

Figure 1:
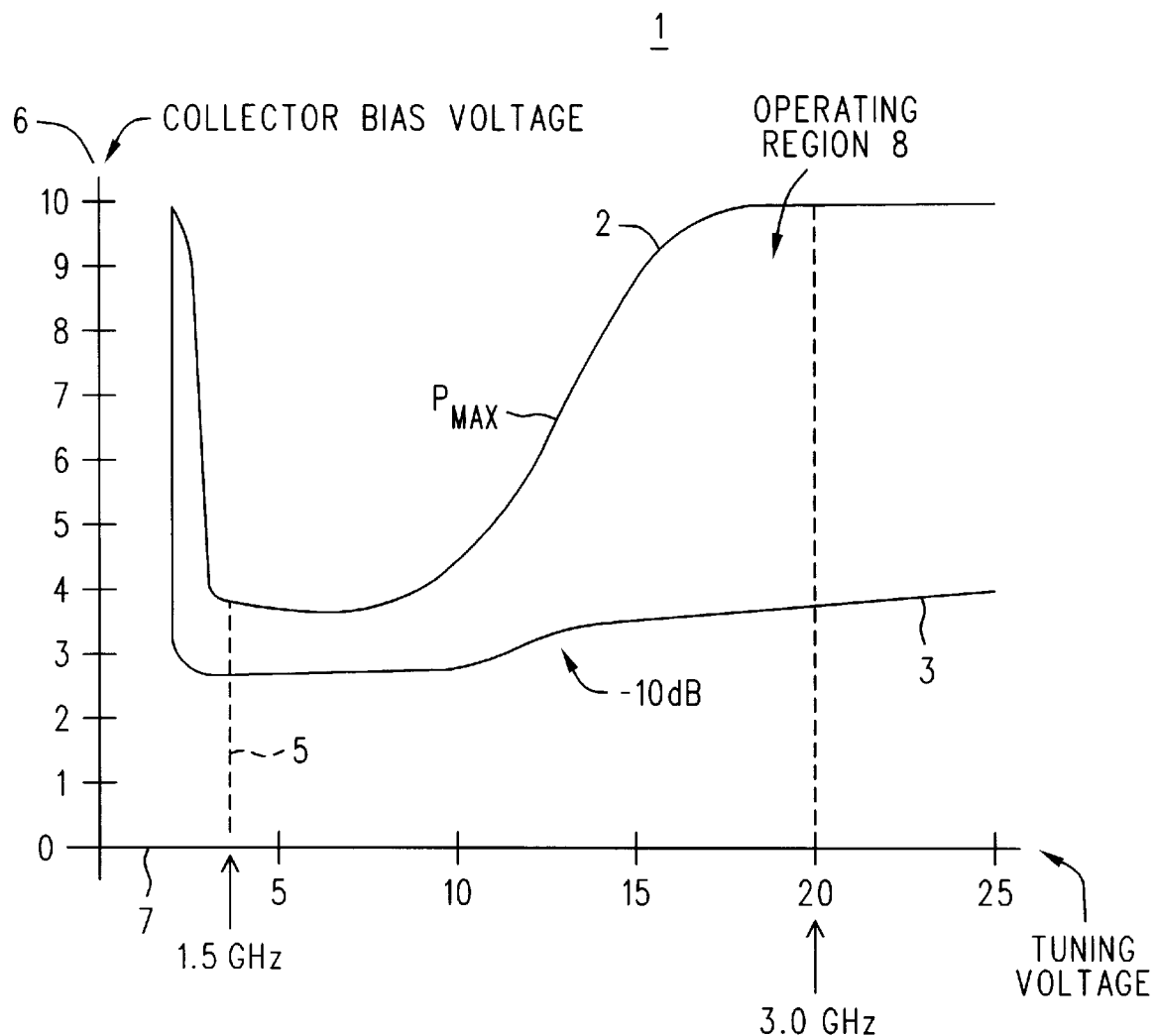
FIG. 1 is a graph of the operating region of an actual negative resistance VCO tunable over the range of 1.5 to 3.0 GHz to which the invention has been applied.

Refer now to FIG. 1, wherein is shown a graph 1 of the operating region 8 of an actual negative resistance VCO tunable over a nominal range of at least 1.5 GHz to 3.0 GHz (1.2 GHz to 3.3 GHz is typical). The abscissa 7 is tuning voltage, which ranges from zero to twenty-five volts. According to the dotted line 5, at a tuning voltage of three volts the VCO operates at 1.5 GHz, and at 3.0 GHz for a tuning voltage of about twenty volts (dotted line 4). However, owing to the nature of the oscillator circuit, merely adjusting the tuning voltage to a value within the dotted lines 4 and 5 is not enough to ensure that the oscillator circuit actually oscillates. According to the graph 1, for each value of tuning voltage (7) there is a range of collector bias voltage (6) that will support oscillation. This range is bounded by the shape of the operating region 8 as shown in the figure. In particular, note the $P_{max}$ line 2 and the −10 dB line 3. The $P_{max}$ line 2 is the value of the collector bias voltage 6 that produces the maximum usable output power as a function of the tuning voltage 7. The −10 dB line 3 is simply the value of collector bias voltage 6 that produces an oscillator output that is ten dB below the maximum usable output possible at that frequency.

In the particular oscillator to be described in connection with FIG. 2, attempts to operate at higher than $P_{max}$ result in the production of sub-harmonics as the oscillator reaches emitter cut-off. Basically, it will be seen from the next figure and then easily appreciated, that the oscillator transistor has a grounded resonant element in its emitter circuit, and a (generally steady) base DC bias having a large oscillatory component. Thus, as the amplitude of oscillations gets sufficiently large, the AC collector current becomes large enough to cause emitter cutoff, briefly biasing the transistor off for a portion of a cycle. This produces undesirable sub-harmonics. Oscillation amplitude can be controlled by collector bias voltage, however. The ability to do this allows the operating point of the oscillator to be actively controlled so that it is always just barely below $P_{max}$ for all values of tuning voltage 7.

Operation of the VCO at a point just below $P_{max}$ (i.e., at point within the operating region 8 that is close to, but not at, $P_{max}$ for the tuning voltage in use) is the preferred point of operation, for all tuning voltages, as it will produce minimal phase noise and maximal output power. The reason for the reduction in phase noise is essentially that the best signal to noise ratio obtains over fixed sources of noise when the signal of interest is largest.

Figure 2:
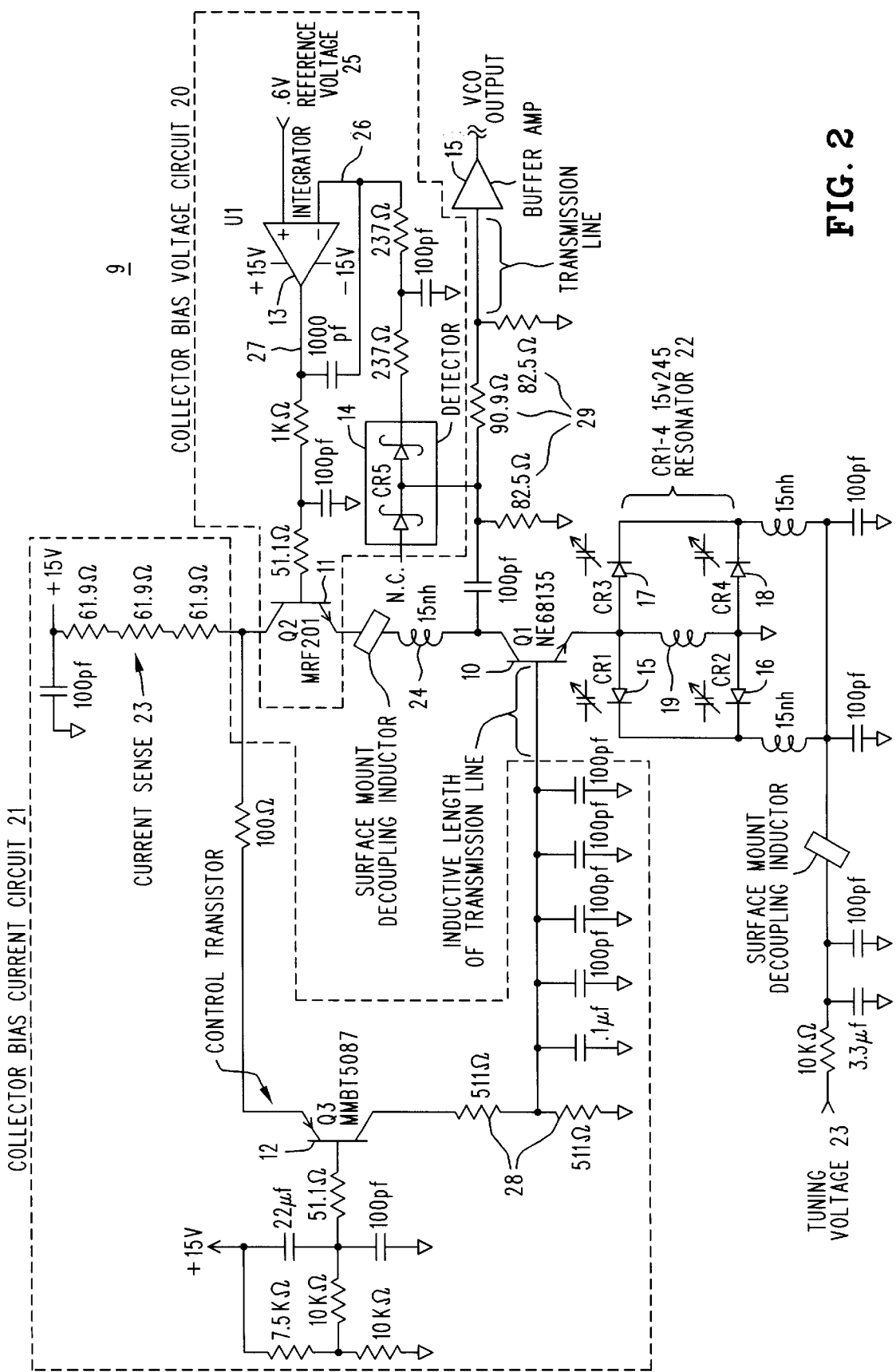
FIG. 2 is a slightly simplified actual schematic for the VCO of FIG. 1.

Refer now to FIG. 2, which is a portion of an actual schematic 9 for a bi-polar negative resistance oscillator whose operating region 8 is shown in FIG. 1. The oscillator device proper is Q1 10, whose base is operated at a bias controlled to produce constant quiescent (or DC) collector current in Q1 according to the action of a collector bias current control circuit 21. This circuit develops a voltage proportional to Q1 collector current across sensor resistance 23, which is then communicated to control transistor Q3 12. It in turn develops a voltage across its tapped collector load resistance 28 that varies Q1's base current to maintain a steady quiescent collector current. An inductive length of transmission line provides the inductive reactance needed to produce negative resistance at the emitter.

Q1 has an electrically tunable resonator 22 in its emitter circuit. The resonator 22 comprises an inductor 19 (preferably an inductance created by a trace and its vias on the printed circuit board) and varactor diodes CR1–CR4 (15–18, respectively). A tuning voltage 23 is applied through a suitable filter and decoupling network to the varactor diodes in the resonator 22. An inductor 24 in series with the collector of Q1 serves as an RF choke to both develop the RF signal and isolate it from Q2 of the collector bias voltage circuit. The RF oscillations are coupled to a detector 14 and to a buffer amplifier 15 through a Pi attenuator 29. The input impedance to attenuator 29 presents a constant RF load to the oscillator. The output of the buffer amplifier 15 is the output of the VCO that is used by other circuitry (not shown).

Oscillations are produced in Q1 according to a negative resistance mechanism that is well known in itself, and that needs no further description. We will point out, however, that although we have shown a preferred instance of using a bipolar transistor as the active oscillator device, PET's are also possible negative resistance devices, given suitable circuit modifications. It should also be pointed out that the technique described herein is not limited to negative resistance oscillators.

Now consider the collector bias voltage circuit 20. A detector 14 produces an indicator voltage proportional to Q1's oscillatory amplitude (i.e., its RF collector current), which is applied (26) to the minus input of U1 13, which is configured as an integrator. The integrator has a plus input that is connected to a reference voltage 25, so that the output 27 of the integrator U1 13 is the integral of the difference between the detector output 26 and the reference voltage 25. The integrator output 27 is filtered and applied to the base of a control transistor Q2 that varies the collector bias voltage for Q1, so as to prevent change in a set point of the oscillatory amplitude of Q1. The reference voltage 25 that is applied to the plus input of the integrator determines the set point (in conjunction with the sensitivity of the detector 14).

At this point it is appropriate to recall that the (DC) collector bias current through Q1 is fixed. (Because of the action of the collector bias current circuit 21, the value of collector bias current is constant, even over variations in frequency of oscillation produced by varying the tuning voltage 23.) Emitter cut-off will begin to occur when peak RF current in the collector (and thus in the resonator in series with the emitter) approaches the value of the collector bias current, and the instantaneous current goes to zero for part of a cycle. Since the collector bias current has a constant value, operation just before emitter cut-off is associated with the condition we have called $P_{max}$. This means that the RF voltage delivered to a fixed load when at or just below $P_{max}$ is constant, also. Hence, a fixed reference voltage 25 may be selected to maintain oscillatory amplitude at just below $P_{max}$ for all values of applied tuning voltage 23.

Figure 3:
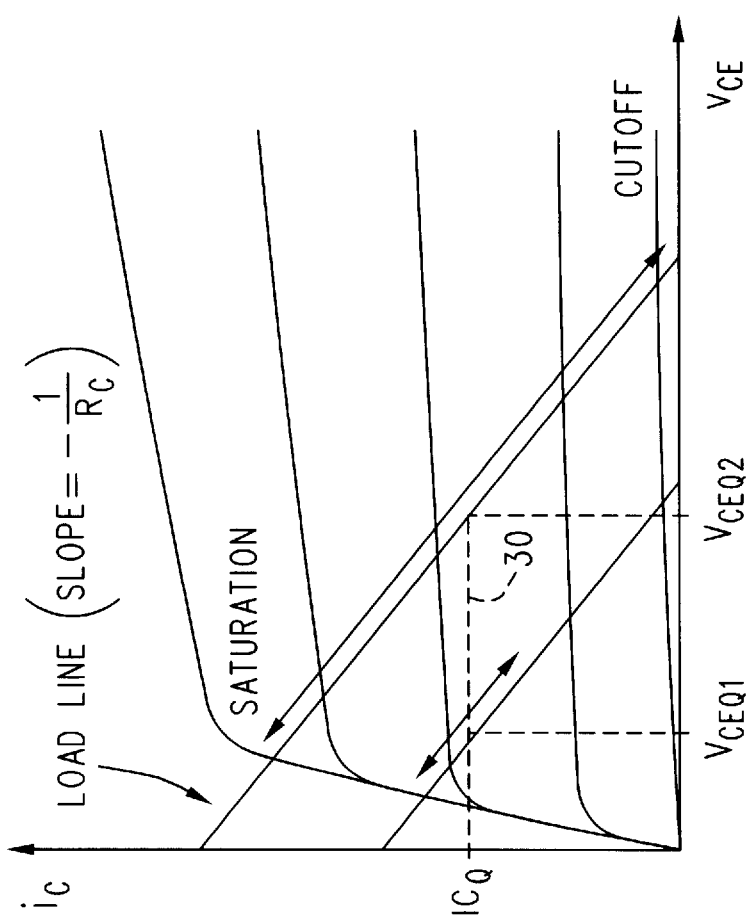
FIG. 3 is an example of collector saturation curves useful in appreciating the relationship between oscillator operating point, emitter cut off, and phase noise.

Oscillator operation at just below $P_{max}$ involves operation just before emitter cut off. The importance of this topic may be further appreciated with reference to FIG. 3, which is an example family of collector saturation curves.

The collector voltage determines the RF signal level at which internal limiting within the oscillator begins. In a preferred embodiment the limiting mechanism is collector saturation. At start-up, the oscillation will grow until the transistor is saturated for part of the cycle; this reduces the gain. As the oscillation level gets higher the transistor is in saturation for a larger portion of the cycle, further reducing gain. The level of oscillation will stabilize when the gain just balances the losses in the resonator.

If the collector bias voltage $V_{CE}$ is too low the oscillation will stabilize while the RF current swing is still small. This will result in degraded phase noise, since the noise floor is a function of the quiescent collector bias current, and is therefore fixed. On the other hand, if $V_{CE}$ is too high the signal swing will keep on growing until emitter cut off is reached. Although this appears to simply further limit signal level, it allows the production of sub-harmonic oscillations, which in turn degrade phase noise. Avoiding emitter cut off will ensure that these sub-harmonic oscillations, or other forms of non-linear behavior, do not occur.

The optimum bias is obtained when $V_{CE}$ is high enough that the instantaneous current approaches zero, or emitter cut off. The behavior of the oscillator of FIG. 2 as a function of $V_{CE}$ can be understood with reference to FIG. 3. At $V_{CE}=0$ there will be no oscillation. Moving to the right on the IC=IC$_Q$ line 30, oscillation will begin somewhere to the right of the saturation region on the transistor curves. This is commonly called the "drop out" voltage. Moving further to the right (increasing V$_{CE}$), the stabilized oscillation level will increase until V$_{CEQ2}$ is reached. At this point peak RF current equals the DC collector bias current, and emitter cut off occurs. It here that sub-harmonic components begin to appear. They degrade phase noise, and are also undesirable in and of themselves.

Figure 4A:
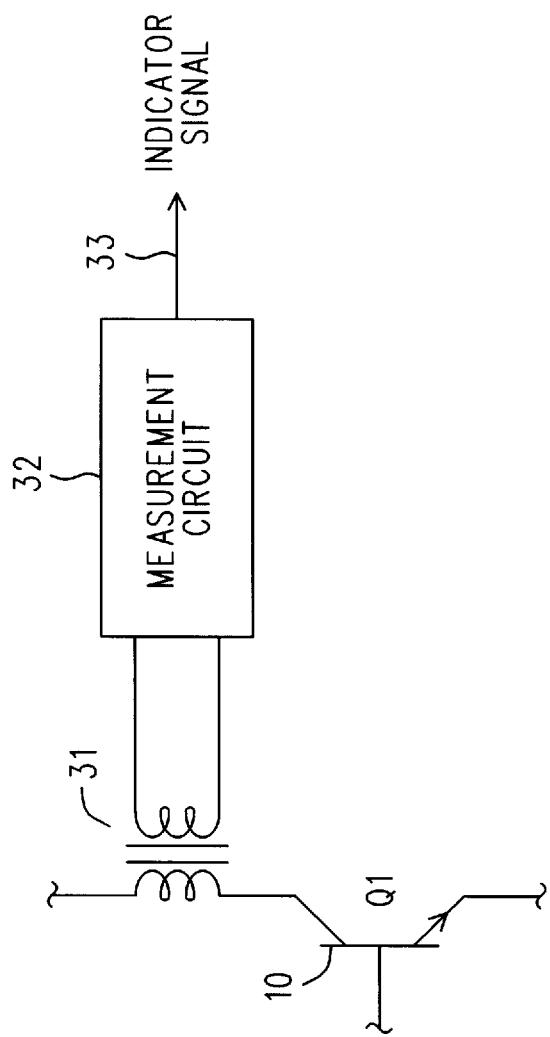
FIGS. 4A and 4B are partial schematic illustrations of an oscillator current sensing technique usable as an alternative to the voltage sensing technique of FIG. 2.
Figure 4B:
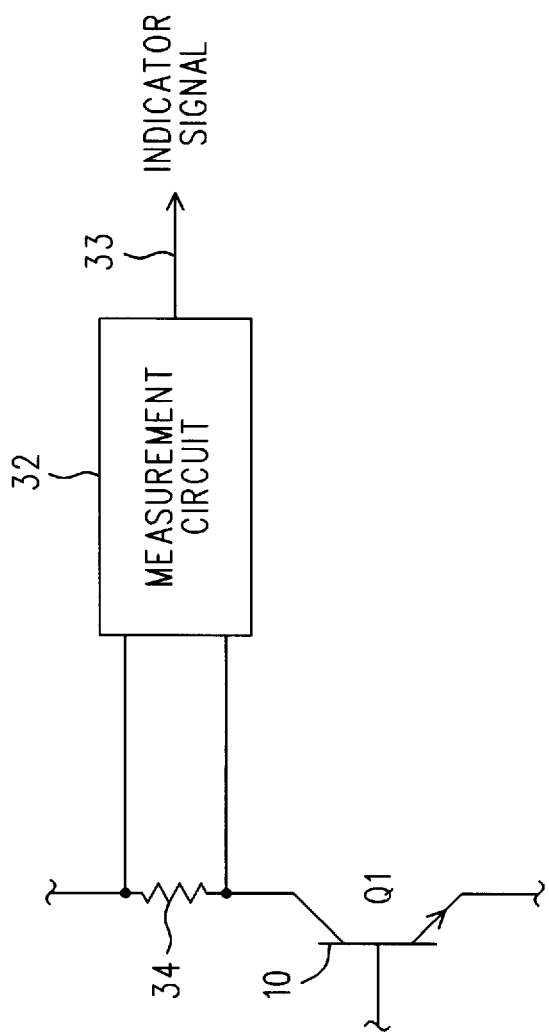

Now suppose that the impedance of the RF load on the oscillator were not constant. This would prevent the use of a simple voltage detector coupled to oscillatory signal. However, an indicator signal could still be developed if the RF current itself were sensed, say with a transformer coupled to a suitable detector. In this way there would still be an indicator signal that would serve as the source of an error signal for a feedback loop that servos a bias signal having an effect on the RF current, and Rf current would still be controlled to remain at an optimal value. Current detectors are shown in FIGS. 4A and 4B. In FIG. 4A the primary of a transformer 31 is in series with the RF current in the oscillator. The secondary is coupled to a measurement circuit 32, which in turn produces an indicator signal 33 (corresponding in FIG. 2 to output 26 of detector 14). In FIG. 4B the current sensor is a resistor 34. The measurement circuit 32 could include peak or rms voltage detection, thermal elements, etc.

I claim:

1. A method of operating a high frequency electronically tunable oscillator containing an active device, the method comprising the steps of:

varying the frequency of oscillation in accordance with a tuning signal;

applying to the active device a bias signal determining a degree of amplitude limiting;

controlling the oscillatory amplitude of the oscillator with the bias signal;

detecting the actual level of the oscillatory amplitude to produce an indicator signal indicative of that oscillatory amplitude;

comparing the indicator signal to a reference signal to produce an error signal;

producing the bias signal from the error signal; and selecting the value of the reference signal to be one at which the associated oscillatory amplitude is at a value that optimizes an oscillator performance parameter.

2. A method of minimizing phase noise in a variable frequency sine wave oscillator, the method comprising the steps of:

varying the frequency of oscillation in accordance with a tuning signal;

operating the variable frequency oscillator at an oscillatory amplitude controlled by a bias signal;

detecting the actual level of the oscillatory amplitude to produce an indicator signal indicative of that oscillatory amplitude;

comparing the indicator signal to a reference signal to produce an error signal;

producing the bias signal from the error signal; and selecting the value of the reference signal to be one at which the oscillatory amplitude is at a near maximal value below a maximal level at which the oscillations exhibit a selected amount of deviation from an ideal sine wave.

3. A wideband variable frequency oscillator comprising:

an active device;

a variable frequency resonator coupled to the active device as part of an oscillator configuration;

a first bias circuit coupled to the active device and setting the level of a first bias parameter;

a variable bias circuit coupled to the active device, setting the level of a variable second bias parameter and operating to alter the amplitude at which the active device oscillates by varying the level of the second bias parameter in accordance with the level of a drive signal applied to an input of the variable bias circuit;

a detector coupled to the active device for creating an indicator signal determined by the amplitude of the oscillations;

a reference signal;

a difference amplifier having inputs coupled to the indicator signal from the detector and to the reference signal, having an output coupled as the drive signal to the input of the variable bias circuit, and operating to maintain the oscillations at an amplitude selected to optimize a performance parameter of the oscillator.

4. An oscillator as in claim 3 wherein the detector includes a diode and the indicator signal is determined by the voltage amplitude of the oscillations.

5. An oscillator as in claim 3 wherein the detector includes a current sensing element and the indicator signal is determined by the current amplitude of the oscillations.

6. An oscillator as in claim 5 wherein the current sensing element includes a transformer.

7. A bipolar negative resistance oscillator comprising:

an oscillator transistor having an emitter, a base and a collector;

a voltage tunable resonator in series with the emitter of the oscillator transistor;

a constant collector bias current source having a current sensor coupled between a power supply and the current input of the collector bias voltage circuit recited immediately below and having a bias current control output connected to the base of the oscillator transistor;

a collector bias voltage circuit having a current input, a bias voltage output and a bias voltage control input;

an impedance coupled between the bias voltage output and the collector of the oscillator transistor;

a fixed RF load coupled to the collector of the oscillator transistor;

an RF detector having an input coupled to the RF voltage across the fixed RF load and having a detector output at which appears a voltage indicative of the amplitude of the RF voltage across the fixed RF load;

a reference voltage; and an error amplifier having two inputs whose amplified difference appears at an error amplifier output, the reference voltage being coupled to one of those inputs and the detector output being coupled to the other one of those inputs, and, the error amplifier output being coupled to the bias voltage control input of the collector bias voltage circuit and operating to maintain the RF voltage across the fixed RF load at a constant amplitude.

8. An oscillator as in claim 7 wherein the fixed RF load includes a buffer amplifier.

9. An oscillator as in claim 7 wherein the voltage tunable resonator comprises a varactor diode.

10. An oscillator as in claim 7 wherein the error amplifier comprises an integrator.

11. An oscillator as in claim 7 wherein collector saturation is a limiting mechanism and the oscillator is operated at a power level that avoids emitter cutoff.

12. A negative resistance oscillator comprising:

an active device having a control input, a current entrance and a current exit;

a voltage tunable resonator in series with the current exit of the active device;

a constant exit current source having a current sensor coupled between a power supply and the current input of the bias voltage circuit recited immediately below and having a bias current control output connected to the control input of the active device;

a bias voltage circuit having a current input, a bias voltage output and a bias voltage control input;

an impedance that substantially blocks the flow of oscillatory current, coupled between the bias voltage output and the current entrance of the active device;

an detector having an input coupled to the active device and a detector output at which appears a signal indicative of the amplitude of RF oscillations;

a reference signal; and an error amplifier having two inputs whose amplified difference appears at an error amplifier output, the reference signal being coupled to one of those inputs and the detector output being coupled to the other one of those inputs, and, the error amplifier output being coupled to the bias voltage control input of the bias voltage circuit and operating to maintain the amplitude of the RF oscillations at a constant level.

13. An oscillator as in claim 12 further comprising a fixed RF load coupled to the current exit of the active device and the detector comprises a diode.

14. An oscillator as in claim 12 wherein the voltage tunable resonator comprises a varactor diode.

15. An oscillator as in claim 12 wherein the error amplifier comprises an integrator.

16. An oscillator as in claim 12 wherein the active device is a FET.

* * * * *